United States Patent
Ziglioli

(10) Patent No.: US 10,153,229 B2
(45) Date of Patent: Dec. 11, 2018

(54) METHOD OF MANUFACTURING SEMICONDUCTOR PRODUCTS, CORRESPONDING SEMICONDUCTOR PRODUCT AND DEVICE

(71) Applicant: STMICROELECTRONICS S.R.L., Agrate Brianza (IT)

(72) Inventor: Federico Giovanni Ziglioli, Pozzo D'Adda (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/860,557

(22) Filed: Jan. 2, 2018

(65) Prior Publication Data
US 2018/0190572 A1 Jul. 5, 2018

(30) Foreign Application Priority Data

Jan. 3, 2017 (IT) .................. 102017000000460

(51) Int. Cl.
*H01L 23/495* (2006.01)
*H01L 23/00* (2006.01)
*H01L 21/66* (2006.01)

(52) U.S. Cl.
CPC ........ *H01L 23/49524* (2013.01); *H01L 22/14* (2013.01); *H01L 22/20* (2013.01); *H01L 22/32* (2013.01); *H01L 23/495* (2013.01); *H01L 23/49548* (2013.01); *H01L 23/49558* (2013.01); *H01L 24/49* (2013.01); *H01L 2224/0392* (2013.01); *H01L 2224/49052* (2013.01); *H01L 2224/49109* (2013.01); *H01L 2224/49112* (2013.01); *H01L 2224/49173* (2013.01)

(58) Field of Classification Search
None
See application file for complete search history.

(56) References Cited

U.S. PATENT DOCUMENTS

| | | | |
|---|---|---|---|
| 5,089,878 A | 2/1992 | Lee | |
| 6,081,024 A * | 6/2000 | Nakamoto | ............ H01L 23/495 257/48 |
| 6,404,216 B1 * | 6/2002 | Tandy | ............... H01L 23/49565 257/E23.05 |
| 2013/0335107 A1 | 12/2013 | Rossi et al. | |
| 2014/0035995 A1 | 2/2014 | Chou et al. | |
| 2017/0323834 A1 * | 11/2017 | Ziglioli | .................. H01L 22/32 |

FOREIGN PATENT DOCUMENTS

JP          H02216475 A          8/1990

* cited by examiner

*Primary Examiner* — Benjamin Sandvik
(74) *Attorney, Agent, or Firm* — Seed IP Law Group LLP

(57) ABSTRACT

A method for use in manufacturing semiconductor devices such as, e.g., semiconductor power devices includes providing: a semiconductor die provided with bonding pads, a lead frame for the semiconductor die, a wire bonding layout including electrically conductive wires coupling bonding pads of the semiconductor die with leads in the lead frame. One or more bonding pads of the semiconductor die is/are coupled to a respective lead in the lead frame via a plurality of wires with a plurality of mutually insulated testing lands in the respective lead, so that the plurality of wires are coupled to respective testing lands. The electrical connection between such a bonding pad and the respective lead may be tested by testing the individual electrical connections between the bonding pad and the plurality of testing lands.

20 Claims, 2 Drawing Sheets

METHOD OF MANUFACTURING SEMICONDUCTOR PRODUCTS, CORRESPONDING SEMICONDUCTOR PRODUCT AND DEVICE

BACKGROUND

Technical Field

The description relates to manufacturing semiconductor products.

One or more embodiments may be applied to testing wire connections in manufacturing semiconductor devices.

Description of the Related Art

Testing wire connections in semiconductor devices in case of multiple wire connections may represent an issue with standard lead frames, e.g., due to multiple wires being at a same voltage.

Addressing such an issue may be a relevant issue for instance in the case of power devices where multiple wire connections may be conventionally adopted.

BRIEF SUMMARY

One or more embodiments facilitate multiple wire testing in semiconductor devices.

One or more embodiments may also relate to a corresponding semiconductor product and a corresponding semiconductor device.

One or more embodiments make it possible, e.g., to test multiple wires connected on a same lead inside a device package.

One or more embodiments may provide plural testing lands on one or more of the leads in a lead frame, e.g., with plural testing lands being insulated (both mutually and from the "bulk" of the corresponding lead) thus providing different electrical paths extending outside a molded package body.

One or more embodiments may provide for that purpose stacked arrangement of layers of conductive materials on the base bulk.

One or more embodiments may provide for the deposition of an insulating layer on a lead tip, by routing the layer on the lead outside the molded package area with a possible deposition of a conductive layer over the insulating layer. In one or more embodiments double layer routing can be applied (also) on the ground ring and/or power bars.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

Figure 1:
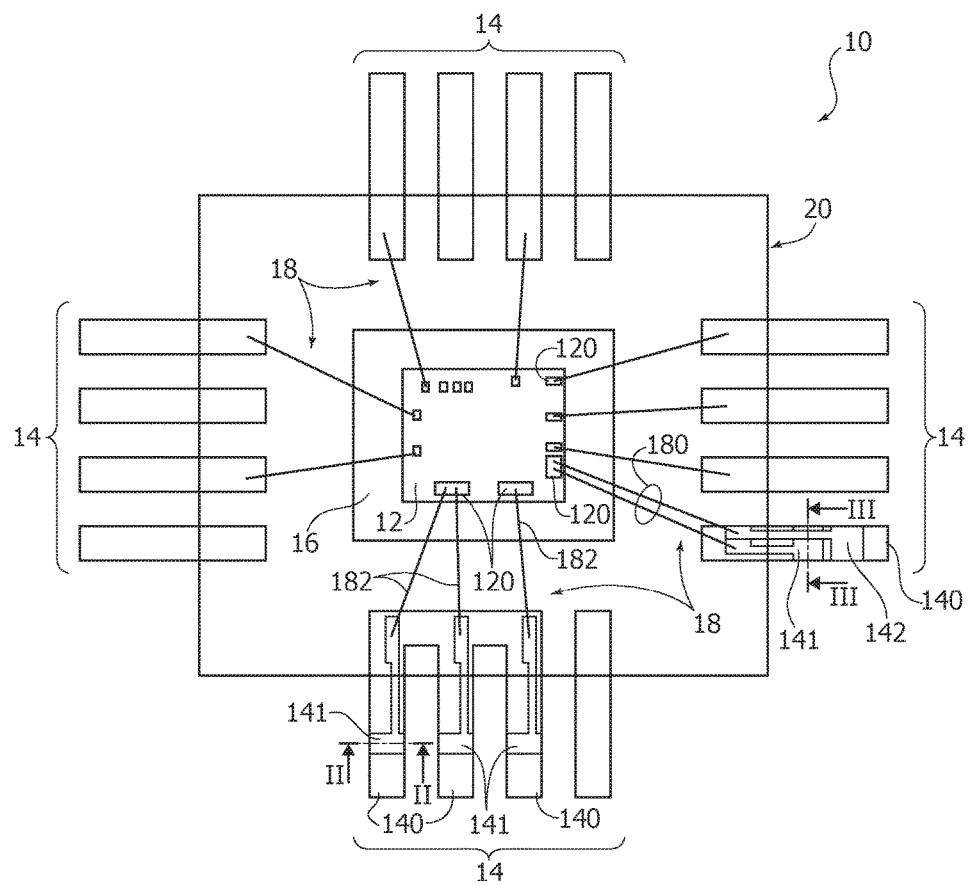
FIG. 1 is a plan view exemplary of one or more embodiments.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

In the figures, reference 10 indicates as a whole a semiconductor device such as, e.g., an integrated circuit (IC).

In one or more embodiments, such a semiconductor device 10 may include a semiconductor die (or "chip") 12 provided with bonding pads 120.

The pads 120 are intended to facilitate electrical connection between the semiconductor die 12 and the leads 14 in a lead frame.

In one or more embodiments, the lead frame may include one or more arrays of electrically conductive leads 14 extending sideways of the semiconductor die 12. Also, a die pad 16 may be provided for supporting the semiconductor die 12.

A wire bonding layout including wires generally designated 18 may be provided for electrically coupling the bonding pads 120 with the leads 14.

A package 20 (e.g., of a plastic material such as a package molding compound—PMC) may be provided onto the semiconductor die with the distal portions of the leads 14 (lead tips) extending externally of the package 20.

An arrangement as discussed in the foregoing is conventional in the art, thus making it unnecessary to provide a more detailed description herein.

Figure 4:
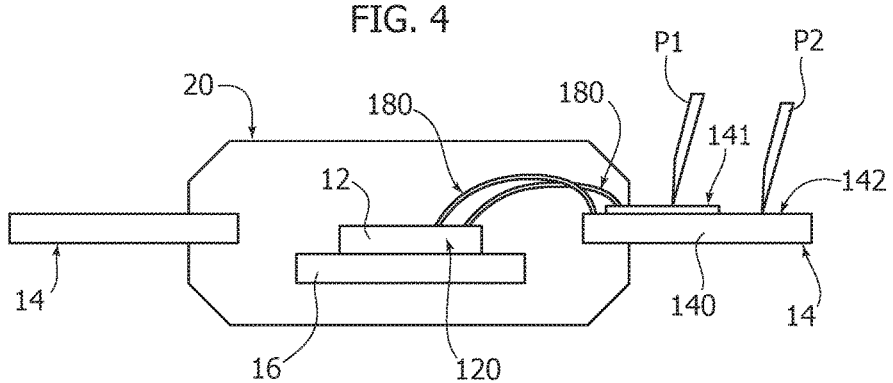
FIGS. 4 to 6 are exemplary of testing steps applied to one or more embodiments.

In one or more embodiments, as exemplified, e.g., in FIGS. 1 and 4, the wire bonding layout may include "multiple wires", that is one or more arrangements wherein (e.g., in order to facilitate transfer of power signals) a certain bonding pad 120 in the semiconductor die 12 may be intended to be coupled with a respective lead 14 in the lead frame via a plurality of wires, e.g., two wires 180 as represented in FIGS. 1 and 4.

In one or more embodiments as exemplified in FIG. 1:
one or more leads 14 intended to be coupled with a bonding pad 120 via plural wires (e.g., 180) may include a corresponding plurality of wire bonding lands 141, 142 provided on the "bulk" 140 of the lead 14,
one or more leads 14 intended to be coupled with a bonding pad 120 via a single wire (e.g., 182) may include only one wire bonding land 141 provided on the bulk 140 of the lead 14,
one or more leads 14 may be coupled with a bonding pad 120 via a wire coupled directly to the bulk 140 of the lead 14.

It will be appreciated that the representation of FIG. 1 is merely exemplary so that, e.g., more than one lead 14 may be provided with plural (two or more) testing lands such as, e.g., 141, 142. Similarly, the provision of testing lands (a single testing land such as 141 or a plurality of testing lands, e.g., 141, 142) may be contemplated for all the leads 14 in the lead frame or only for a portion of them.

Figure 2:
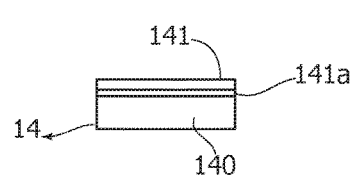
FIGS. 2 and 3 essentially correspond to cross-sectional views along lines II-II and of FIG. 1, reproduced in an enlarged scale.

FIG. 2 is exemplary of the possibility of providing on the (e.g., copper) bulk 140 of a lead 14 a (first) testing land 141 including an electrically conductive layer (e.g., of a metal material such as gold or silver) possibly electrically insulated from the bulk of the lead 14 by an insulating layer 141a.

Figure 3:
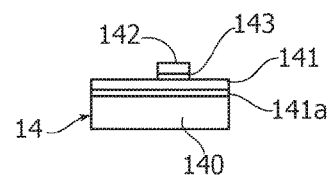

FIG. 3 is exemplary of one or more embodiments which, in addition to the provision of such a first testing land 141, may involve providing one or more further testing lands (e.g., a second testing land 142) electrically insulated from the other testing land(s)—and from the lead bulk 140 by an insulating layer 143.

In one or more embodiments, such a stacked arrangement may include more than two testing lands, e.g., three or more testing lands with corresponding insulation therebetween and corresponding bonding wires to a bonding pad 120 in the semiconductor die 12.

In one or more embodiments the provision of plural testing lands (e.g., 141, 142, . . . ) electrically insulated from each other may be in the form of a stack of layers. In one or more embodiments, the or each insulating layer (e.g., 141a, 143) may include electrically insulating material such as, e.g., poly methyl silsesquioxane (PMSQ), Ta—Al—Si— alkoxide, Zinc Tin Oxide, Polyimide Polyvinylpyrrolidone (PVP) or photoresist material such as SU-8.

In one or more embodiments as exemplified in FIG. 4, a certain lead 14 may be intended to be coupled with a bonding pad 120 via plural wires (e.g., two wires 180), one of which is coupled to the bulk 140 of the lead, which may thus be regarded as forming a respective (e.g., second) testing land 142 insulated from the first land 141, e.g., via an insulating layer (not visible in the figure).

As exemplified in FIG. 4, in one or more embodiments (whatever the arrangement adopted for providing the testing lands), testing of the electrical connection between a bonding pad 120 coupled with a respective lead 14 via a multiple-wire connection (e.g., including two bonding wires 180) may take place by testing the individual electrical connections between the pad 120 and each one of the testing lands 141, 142.

In one or more embodiments, testing may take place according to any procedure known for that purpose, e.g., by means of testing probes P1, P2 brought into contact with the testing lands 141 and 142.

In one or more embodiments the testing lands 141, 142 may be provided, e.g., by resorting to aerosol jet printing, e.g., as disclosed in US2014/0035995. In one or more embodiments other known techniques may be used for providing the testing lands in question.

Figure 5:
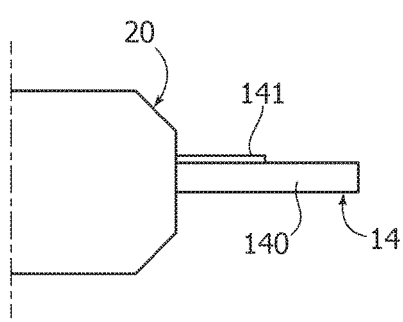
Figure 6:
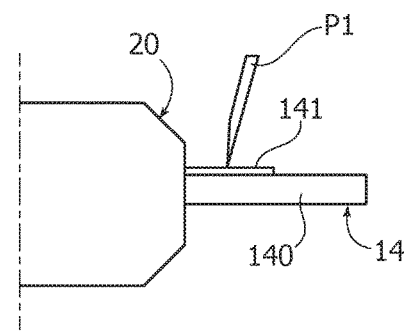

FIGS. 5 and 6 are exemplary of possible testing carried out (again in a manner known per se) in the case of those leads 14 wherein, as is the case of the leads appearing at the bottom of FIG. 1, using a single bonding wire 182 and a single testing land 141 may be contemplated.

It will be noted that in either case (FIG. 4 and FIG. 6) testing may take place with the package 20 (already) formed on the semiconductor die/lead frame assembly (e.g., including elements 12, 14, 16, 18) by taking advantage of the testing lands such as 141, 142 being provided at the lead tips, that is at the distal portions of the leads 14 extending externally of (e.g., protruding radially from) the package 20.

In one or more embodiments such testing may be performed at a strip level of the lead frame, e.g., before plating as discussed in the following.

In one or more embodiments, following wire bond testing being finalized (e.g., once wire bond testing is completed) the—so to say, intermediate—semiconductor product onto which testing has been performed without the product being found faulty or defective—e.g., due to any wire bonding found unduly open or short-circuited (O/S)—may be completed to a proper semiconductor device by completing electrical coupling of the die pads 120 to the leads 14, e.g., to the electrically conductive bulk 140 of the leads 14.

Figure 7:
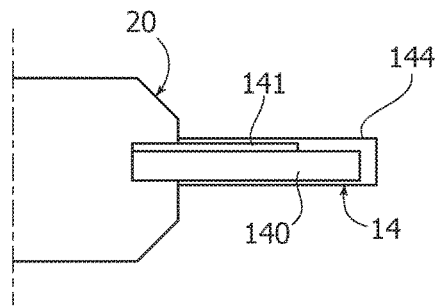
FIG. 7 is exemplary of a further possible step in one or more embodiments.

FIG. 7 is exemplary of the possibility, in one or more embodiments of applying onto the leads 14 electrically-conductive material—e.g., a tin plating of, e.g., 8-10 micron (1 micron=$10^{-6}$ m) thickness.

In one or more embodiments applying such electrically-conductive material may provide an electrically-conductive path, that is electrical conductivity, i) between plural (e.g., stacked) testing lands 141, 142 and/or ii) between the or each testing land and the bulk 140 of the lead in which the testing land(s) is/are provided.

For instance, the electrically-conductive material 144 may provide an electrically-conductive path between a testing land 141 (and the bonding wire coming down to it) and the bulk 140 of the lead 14, e.g., in those cases where the testing land 141 is electrically insulated (e.g., at 141a in FIG. 2) with respect to the lead bulk 140.

In one or more embodiments, where plural testing lands are provided having an electrically insulating layer therebetween (e.g., 141, 142 and 143 as exemplified in FIG. 3), the electrically-conductive material 144 makes it possible to "short circuit" the plural wires intended to electrically couple a certain die pad 120 to a certain lead 14, e.g., by short-circuiting respective testing pads such as 141 and 142 with the lead bulk 140.

In one or more embodiments, the electrically-conductive material 144 may provide an electrically-conductive path between the various testing lands 141, 142 insofar as the electrically conductive material 144 may provide electrically-conductive paths between each testing land and the electrically conductive bulk 140 of the lead 14.

In one or more embodiments, insulation between the testing lands (e.g., 141, 142) may be removed by other means (e.g., by at least partially removing the insulating layer 143 and/or making that insulating layer electrically conductive, e.g., by "burning" or similar processes as used, e.g., in "antifuse" technology).

In one or more embodiments, a method may include:
providing a semiconductor die (e.g., 12) provided with bonding pads (e.g., 120),
providing a lead frame (e.g., 14) for the semiconductor die,
providing a wire bonding layout (e.g., 18) including electrically conductive wires coupling bonding pads of the semiconductor die with leads in the lead frame, wherein at least one bonding pad of the semiconductor die is coupled to a respective lead in the lead frame via a plurality of wires,
providing in said respective lead a plurality of mutually insulated testing lands (e.g., 141, 142), wherein said plurality of wires are coupled to respective testing lands in said plurality of testing lands,
testing (e.g., P1, P2 in FIG. 4) the electrical connection between said at least one bonding pad and said respective lead by testing the individual electrical connections between said at least one bonding pad and said testing lands in said plurality of testing lands.

In one or more embodiments, the plurality of testing lands may include a stacked arrangement of insulated testing lands.

One or more embodiments may include at least one further bonding pad of the semiconductor die coupled with a further respective lead via a single wire (e.g., 182) for electrically coupling said at least one further bonding pad to said further respective lead, with the method including:
  providing in said further respective lead a single testing land wherein said single wire is coupled with said single testing land,
  testing (see, e.g., FIG. 6) the electrical connection between said at least one further bonding pad and said further respective lead by testing the electrical connection between said further bonding pad and said single testing land in said further respective lead.

In one or more embodiments, said leads in the lead frame may include an electrically-conductive bulk (e.g., 140), the method including providing electrical insulation (e.g., at 141a) between said testing lands and the bulk of the lead in which the testing lands are provided.

One or more embodiments may include forming a device package (e.g., 20) onto said semiconductor die with leads in said lead frame having distal ends extending externally of the device package, the method including providing said testing lands at said distal ends of the leads in said lead frame.

One or more embodiments may include performing said testing (e.g., P1; P1, P2) with said package (already or being) formed onto said semiconductor die.

One or more embodiments, may include, following said testing, providing an electrically-conductive path (e.g., 144) between the testing lands of said plurality of testing lands.

In one or more embodiments, said leads in the lead frame may include an electrically-conductive bulk, and the method may include applying electrically-conductive material (e.g., 144) to said testing lands to provide an electrically-conductive path to the bulk of the lead in which the testing lands are provided.

One or more embodiments may provide an (intermediate) semiconductor product including:
  a semiconductor die provided with bonding pads,
  a lead frame for the semiconductor die,
  a wire bonding layout including electrically conductive wires coupling bonding pads of the semiconductor die with leads in the lead frame, wherein at least one bonding pad of the semiconductor die is coupled to a respective lead in the lead frame via a plurality of wires,
  a plurality of mutually insulated testing lands in said respective lead, wherein said plurality of wires are coupled to respective testing lands in said plurality of testing lands,
  wherein (in said intermediate semiconductor product) the individual electrical connections between said at least one bonding pad and said testing lands in said plurality of testing lands are available (e.g., accessible from outside the device package) for testing the electrical connection between said at least one bonding pad and said respective lead.

In one or more embodiments the plurality of testing lands may include a stacked arrangement of testing lands.

In one or more embodiments an (intermediate) semiconductor product may include:
  at least one further bonding pad of the semiconductor die coupled with a further respective lead via a single wire for electrically coupling said at least one further bonding pad to said further respective lead,
  a single testing land in said further respective lead wherein said single wire is coupled with said single testing land,
  wherein the electrical connection between said further bonding pad and said single testing land in said further respective lead is available (e.g., accessible from outside the device package) for testing the electrical connection between said at least one further bonding pad and said further respective lead.

In one or more embodiments a semiconductor device (e.g., a semiconductor power device) may including the (intermediate) semiconductor product of one or more embodiments wherein an electrically-conductive path is provided between the testing lands of said plurality of testing lands.

In one or more embodiments said leads in the lead frame include an electrically-conductive bulk with electrically-conductive material applied to said testing lands to provide an electrically-conductive path to the bulk of the lead in which the testing lands are provided.

Without prejudice to the underlying principles, the details and embodiments may vary, even significantly, with respect to what has been described by way of example only without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method including:
  providing a semiconductor die provided with bonding pads,
  providing a lead frame for the semiconductor die,
  providing a wire bonding layout including electrically conductive wires coupling bonding pads of the semiconductor die with leads in the lead frame, wherein a first bonding pad of the semiconductor die is coupled to a first lead in the lead frame via a plurality of wires of the electrically conductive wires, and
  providing in said first lead a plurality of mutually insulated testing lands, wherein said plurality of wires are coupled to respective testing lands in said plurality of mutually insulated testing lands.

2. The method of claim 1, wherein the plurality of mutually insulated testing lands includes a stacked arrangement of insulated testing lands.

3. The method of claim 1, wherein providing a wire bonding layout includes providing a single wire that couples a second bonding pad of the semiconductor die with a second lead for electrically coupling said second bonding pad to said second lead, the method including:
  providing in said second lead a single testing land wherein said single wire is coupled with said single testing land,
  testing an electrical connection between said second bonding pad and said second lead by testing an electrical connection between said second pad and said single testing land in said second lead.

4. The method of claim 1, wherein said first lead includes an electrically-conductive bulk, the method including providing electrical insulation between said testing lands and the bulk of the first lead.

5. The method of claim 1, including forming a device package onto said semiconductor die with leads in said lead frame having distal ends extending externally of the device package, the method including providing said testing lands at said distal end of the first lead.

6. The method of claim 5, including performing said testing with said package formed onto said semiconductor die.

7. The method of claim 1, further comprising:
testing an electrical connection between said first bonding pad and said first lead by testing individual electrical connections between said first bonding pad and said testing lands in said plurality of mutually insulated testing lands.

8. The method of claim 7, including, following said testing, providing an electrically-conductive path between the testing lands of said first lead.

9. The method of claim 1, wherein said leads in the lead frame include an electrically-conductive bulk, the method including applying electrically-conductive material to said testing lands to provide an electrically-conductive path to the bulk of the first lead.

10. A semiconductor product including:
a semiconductor die provided with bonding pads,
a lead frame for the semiconductor die,
a wire bonding layout including electrically conductive wires coupling bonding pads of the semiconductor die with leads in the lead frame, wherein a first bonding pad of the semiconductor die is coupled to a first lead in the lead frame via a plurality of wires of the electrically conductive wires,
a plurality of mutually insulated testing lands in said first lead, wherein said plurality of wires are coupled to respective testing lands in said plurality of mutually insulated testing lands,
wherein individual electrical connections between said first bonding pad and said testing lands in said plurality of mutually insulated testing lands are available for testing an electrical connection between said first bonding pad and said first lead.

11. The semiconductor product of claim 10, wherein the plurality of testing lands includes a stacked arrangement of testing lands.

12. The semiconductor product of claim 10, wherein:
the semiconductor die includes a second bonding pad coupled with a second lead of the lead frame via a single wire of the electrically conductive wires for electrically coupling said second bonding pad to said second lead,
the second lead includes a single testing land,
said single wire is coupled with said single testing land, and
an electrical connection between said second pad and said single testing land in said second lead is available for testing an electrical connection between said second bonding pad and said second lead.

13. The semiconductor product of claim 10, including a package on said semiconductor die with leads in said lead frame having distal ends extending externally of the device package, the testing lands being positioned at said distal end of the first lead.

14. The semiconductor product of claim 10, wherein said first lead includes an electrically-conductive bulk, and electrical insulation between said testing lands and the bulk of the first lead.

15. A semiconductor device, comprising:
a semiconductor die provided with bonding pads,
a lead frame for the semiconductor die,
a wire bonding layout including electrically conductive wires coupling bonding pads of the semiconductor die with leads in the lead frame, wherein a first bonding pad of the semiconductor die is coupled to a first lead in the lead frame via a plurality of wires of the electrically conductive wires,
a plurality of testing lands in said first lead, wherein said plurality of wires are coupled to respective testing lands in said plurality of testing lands,
wherein individual electrical connections between said first bonding pad and said testing lands in said plurality of mutually insulated testing lands are available for testing an electrical connection between said first bonding pad and said first lead, wherein an electrically-conductive path is provided between the testing lands of said first lead.

16. The semiconductor device of claim 15, wherein said first lead includes an electrically-conductive bulk with electrically-conductive material applied to said testing lands to provide an electrically-conductive path to the bulk of the first lead.

17. The semiconductor device of claim 15, wherein the plurality of testing lands includes a stacked arrangement of testing lands.

18. The semiconductor device of claim 15, wherein:
the semiconductor die includes a second bonding pad coupled with a second lead of the lead frame via a single wire of the electrically conductive wires for electrically coupling said second bonding pad to said second lead,
the second lead includes a single testing land,
said single wire is coupled with said single testing land, and
an electrical connection between said second pad and said single testing land in said second lead is available for testing an electrical connection between said second bonding pad and said second lead.

19. The semiconductor device of claim 15, wherein said first lead includes an electrically-conductive bulk and electrical insulation between said testing lands and the bulk of the first lead.

20. The semiconductor device of claim 19, wherein the electrically-conductive path includes electrically-conductive material on said testing lands and the bulk.

* * * * *